United States Patent
Yoon

(10) Patent No.: US 11,464,084 B2
(45) Date of Patent: Oct. 4, 2022

(54) COOKING VESSEL DETECTION APPARATUS, COOKING VESSEL DETECTION METHOD, AND INDUCTION HEATING COOKER

(71) Applicant: LG ELECTRONICS INC., Seoul (KR)

(72) Inventor: Bada Yoon, Seoul (KR)

(73) Assignee: LG ELECTRONICS INC., Seoul (KR)

(*) Notice: Subject to any disclaimer, the term of this patent is extended or adjusted under 35 U.S.C. 154(b) by 614 days.

(21) Appl. No.: 16/344,777

(22) PCT Filed: Nov. 1, 2017

(86) PCT No.: PCT/KR2017/012236
§ 371 (c)(1),
(2) Date: Apr. 24, 2019

(87) PCT Pub. No.: WO2018/093073
PCT Pub. Date: May 24, 2018

(65) Prior Publication Data
US 2019/0335547 A1    Oct. 31, 2019

(30) Foreign Application Priority Data
Nov. 16, 2016    (KR) .................. 10-2016-0152805

(51) Int. Cl.
*H05B 6/06* (2006.01)
*G01R 19/165* (2006.01)
*G01R 19/10* (2006.01)

(52) U.S. Cl.
CPC ............ *H05B 6/062* (2013.01); *G01R 19/10* (2013.01); *G01R 19/165* (2013.01); *H05B 2213/05* (2013.01)

(58) Field of Classification Search
CPC .... G01R 19/165; G01R 19/10; H05B 2213/05
See application file for complete search history.

(56) References Cited

U.S. PATENT DOCUMENTS 3,814,888 A * 6/1974 Bowers ............... H02M 7/5236
219/624
5,376,775 A * 12/1994 Lee ........................ H02M 7/537
219/665

(Continued)

FOREIGN PATENT DOCUMENTS

EP    2 330 866    6/2011
JP    2002/151243    5/2002

(Continued)

OTHER PUBLICATIONS

International Search Report (with English Translation) and Written Opinion dated Mar. 14, 2018 issued in Application No. PCT/KR2017/012236.

(Continued)

*Primary Examiner* — Dana Ross
*Assistant Examiner* — Kuangyue Chen
(74) *Attorney, Agent, or Firm* — KED & Associates LLP

(57) ABSTRACT

An induction heating cooker comprises a rectifying unit for rectifying an AC voltage from a power supply to a DC voltage and first and second switching units for switching to alternately apply the DC voltage from the rectifying unit to the working coil for driving the working coil.

A device of sensing a cooking container in the induction heating cooker comprises a first current sensing unit configured to sense a first current flowing between the power supply and the rectifying unit, a second current sensing unit configured to sense a second current flowing to the working (Continued)

coil, and a controller configured to determine if the cooking container placed on the working coil is present based on the first and second currents.

3 Claims, 2 Drawing Sheets

(56) References Cited

U.S. PATENT DOCUMENTS

| | | | |
|---|---|---|---|
| 2007/0125768 A1* | 6/2007 | Kim | H05B 6/062 |
| | | | 219/626 |
| 2009/0321425 A1 | 12/2009 | Meier | |
| 2011/0120989 A1 | 5/2011 | Schilling et al. | |
| 2015/0250027 A1* | 9/2015 | Takano | H05B 6/062 |
| | | | 219/664 |
| 2019/0018048 A1* | 1/2019 | Yun | H05B 6/12 |

FOREIGN PATENT DOCUMENTS

| | | |
|---|---|---|
| KR | 10-0141797 | 8/1998 |
| KR | 014797 B1 * | 8/1998 |
| KR | 10-0204886 | 6/1999 |
| KR | 100204886 B1 * | 6/1999 |
| KR | 10-1999-0076000 | 10/1999 |
| KR | 10-2003-0027222 | 4/2003 |
| KR | 10-0661226 | 12/2006 |
| KR | 10-1462093 | 11/2014 |
| WO | WO 2008/055370 | 5/2008 |

OTHER PUBLICATIONS

European Search Report dated May 12, 2020.

\* cited by examiner

COOKING VESSEL DETECTION APPARATUS, COOKING VESSEL DETECTION METHOD, AND INDUCTION HEATING COOKER

CROSS-REFERENCE TO RELATED PATENT APPLICATIONS

This application is a U.S. National Stage Application under 35 U.S.C. § 371 of PCT Application No. PCT/KR2017/012236, filed Nov. 1, 2017, which claims priority to Korean Patent Application No. 10-2016-0152805, filed Nov. 16, 2016, whose entire disclosures are hereby incorporated by reference.

TECHNICAL FIELD

The present invention relates to a device of sensing a cooking container, method thereof, and an induction heating cooker.

BACKGROUND ART

Generally, in an induction heating cooker, a cooking container itself is induction-heated by an eddy current flowing when a magnetic force line generated in a working coil passes through the cooking container, and the cooking is performed.

Korean Patent Publication No. 2003-0027222 (hereinafter referred to as Prior Art 1) discloses a device of sensing a cooking container capable of detecting the absence of a cooking container without malfunction.

In the prior art 1, a voltage divided by a pair of voltage dividing resistors provided at one end of the working coil are compared with a reference voltage, and a method of detecting the absence of the cooking container based on the comparison result is presented.

However, in the case of the prior art 1, there is a problem that the resistance, the working coil, the gap between the working coil and the cooking container, and the mechanical assembly scattering are greatly influenced, and when the scattering is out of the control range, the cooking container is not normally detected.

DISCLOSURE

Technical Problem

The present invention is directed to solving the above-mentioned problems and other problems.

It is another object of the present invention to provide a cooking container sensing device, a cooking container sensing method, and an induction heating cooker capable to minimize the sensing error of a cooking container despite the factors affecting the sensing error.

Technical Solution

According to an aspect of the present invention, a device of sensing a cooking container in an induction heating cooker, the induction heating cooker comprising a rectifying unit for rectifying an AC voltage from a power supply to a DC voltage and first and second switching units for switching to alternately apply the DC voltage from the rectifying unit to the working coil for driving the working coil, comprising: a first current sensing unit connected between the power supply and the rectifying unit to sense a first current flowing between the power supply and the rectifying unit; a second current sensing unit connected between a node between the first and second switching units and the working coil to sense a second current flowing to the working coil; and a controller configured to determine if the cooking container placed on the working coil is present based on the first and second currents.

According to another aspect of the present invention, a method of sensing a cooking container in an induction heating cooker, the induction heating cooker comprising a rectifying unit for rectifying an AC voltage from a power supply to a DC voltage and first and second switching units for switching to alternately apply the DC voltage from the rectifying unit to the working coil for driving the working coil, comprising: connecting between the power supply and the rectifying unit to sense a first current flowing between the power supply and the rectifying unit; connecting between a node between the first and second switching units and the working coil to sense a second current flowing to the working coil; and determining if the cooking container placed on the working coil is present based on the first and second currents.

According to another aspect of the present invention, an induction heating cooker, comprises: a power supply configured to generate an AC voltage; a rectifying unit AC voltage configured to rectify the generated AC voltage to a DC voltage; first and second switching units configured to switch the DC voltage from the rectifying unit to alternately apply the DC voltage to the working coil for driving the working coil; a first current sensing unit connected between the power supply and the rectifying unit to sense a first current flowing between the power supply and the rectifying unit; a second current sensing unit connected between a node between the first and second switching units and the working coil to sense a second current flowing to the working coil; and a controller configured to determine the cooking container placed on the working coil is present based on the first and second currents.

Advantageous Effects

Effects of a device of sensing a cooking container, method thereof, and an induction heating cooker according to the present invention will be described as follows.

According to at least one of the embodiments of the present invention, it is possible to detect not only a second current sensed near the working coil but also a first current from an output terminal of the power supply, and to detect determine if the cooking container is present based on the ratio of the first current to the second current such that the detection error of the cooking container is minimized despite the factors affecting the sensing error such as resistance, working coil, gap between the working coil and the cooking container.

Further scope of applicability of the present invention will become apparent from the following detailed description. It should be understood, however, that the detailed description and specific examples, such as the preferred embodiments of the invention, are given by way of illustration only, since various changes and modifications within the spirit and scope of the invention will be apparent to those skilled in the art.

MODE FOR INVENTION

Figure 1:
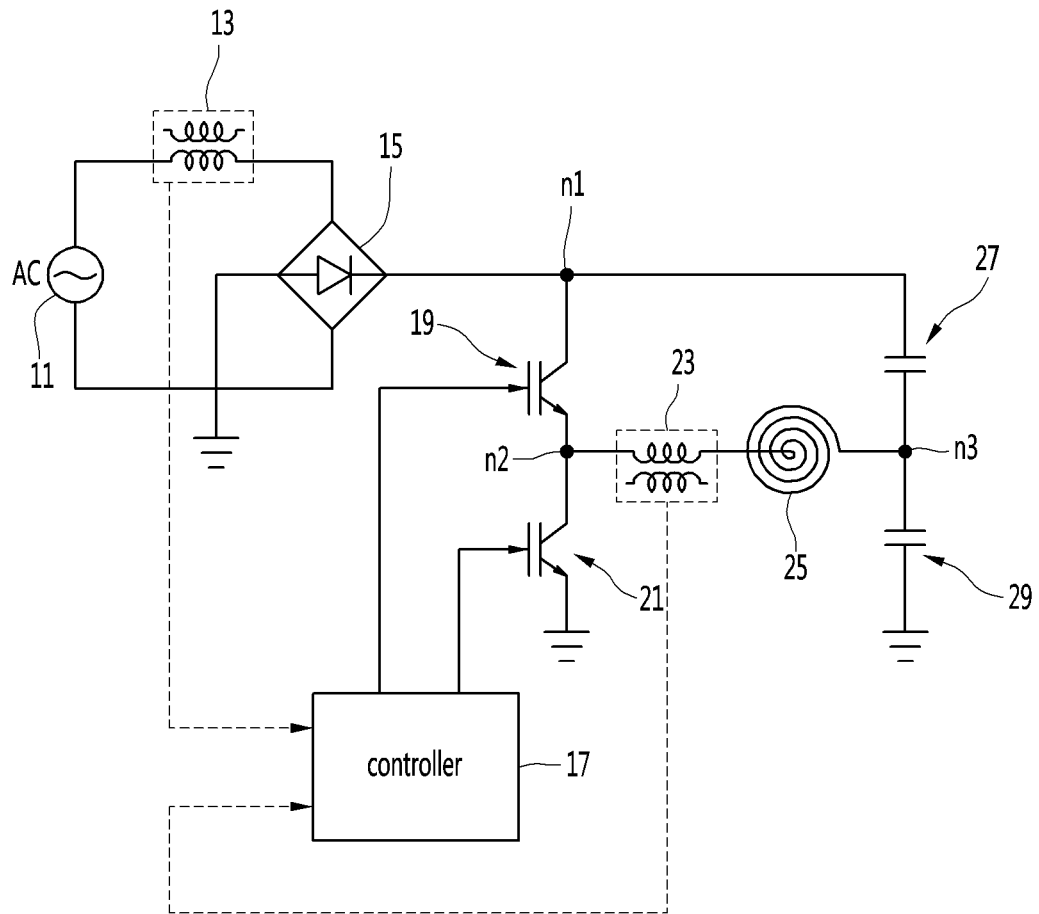
FIG. 1 is a circuit diagram showing an induction heating cooker according to an embodiment of the present invention.

Hereinafter, embodiments disclosed in this specification will be described in detail with reference to the accompanying drawings, and the same or similar components are denoted by the same reference numerals regardless of the reference numerals, and redundant description thereof will be omitted. The suffix "module", "unit" and "part" for the components used in the following description are given or mixed in consideration of ease of specification, and do not have their own meaning or role. In the following description of the embodiments of the present invention, a detailed description of related arts will be omitted when it is determined that the gist of the embodiments disclosed herein may be blurred. The accompanying drawings are included to provide a further understanding of the invention and are incorporated in and constitute a part of this specification, and it is to be understood that the invention is intended to cover all modifications, equivalents, and alternatives falling within the spirit and scope of the invention.

FIG. 1 is a circuit diagram showing an induction heating cooker according to an embodiment of the present invention.

Referring to FIG. 1, an induction heating cooker according to an embodiment of the present invention includes a power supply 11, a rectifying unit 15, first and second switching units 19 and 21, first and second capacitors 27 and 29, and a controller 17.

In addition, the induction heating cooker may further include first and second current sensing units 13 and 23 used for sensing the absence of the cooking container.

The power supply 11 can generate and output an AC voltage.

The rectifying unit 15 is connected to the power supply 11 and is capable of rectifying the AC voltage from the power supply 11 to a DC voltage.

Each of the first and second switching units 19 and 21 can be periodically switched under the control of the controller 17.

Each of the first and second switching units 19 and 21 may include, for example, an insulated-gate-bipolar-transistor (IGBT) device or a thyristor device, which is a high-speed switching device for power.

Hereinafter, for convenience of explanation, the first and second switching units 19 and 21 each include an IGBT device.

The first switching unit 19 may be connected between a first node n1 and a second node n2. Specifically, a gate terminal of the first switching unit 19 is connected to the controller 17, a collector terminal of the first switching unit 19 is connected to the first node n1, and an emitter terminal of the first switching unit 19 is connected to the second node n2.

The first node n1 may be connected to one end of the rectifying unit 15.

The second switching unit 21 may be connected between the second node n2 and a ground terminal. Specifically, a gate terminal of the second switching unit 21 is connected to the controller 17, a collector terminal of the second switching unit 21 is connected to the second node n2, and an emitter terminal of the second switching unit 21 is connected to the ground terminal.

The first capacitor 27 may be connected between the first node n1 and a third node n3. The second capacitor 29 may be connected between the third node n3 and the ground terminal.

In addition, a working coil 25 may be connected between the second node n2 and the third node n3.

The first and second switching units 19 and 21 are alternately turned on so that the DC voltage from the rectifying unit 15 can be applied to the working coil 25 with the AC voltage. A specific frequency can be determined by the number of periodic turn-on times of the first and second switching units 19 and 21. At this time, the specific frequency may be equal to a resonance frequency of a LC resonance circuit constituted by an inductance component L of the working coil 25 and a capacitance component C of the first and/or second capacitors 27 and 29.

For example, when the first switching unit 19 is turned on, the DC voltage from the rectifying unit 15 flows in the order of the first switching unit 19, the working coil 25, and the second capacitor 29 A current flow path may be formed.

For example, when the second switching unit 21 is turned on, the DC voltage from the rectifying unit 15 flows in the order of the first capacitor 27, the working coil 25, and the second switching unit 21 to form a current flow path.

Thus, the working coil 25 is periodically or alternately supplied with the DC voltage from a first side to a second side and from the second side to the first side so that an AC voltage having a specific frequency can be formed. A resonance current flows through the working coil 25 by the AC resonance circuit with the AC voltage having the specific frequency, and the eddy current can be induced in the cooking container by the resonance current. At this time, the resonance current may fluctuate depending on whether an eddy current is generated or not. This will be described in detail later.

When the cooking heating start signal is input, the controller 17 controls the first and second switching units 19 and 21 to supply first and second gate control signals (G1 and G2 in FIG. 3) to the first and second switching units 19 and 21. The first and second gate control signals (G1 and G2 in FIG. 3) of the pulse waveform can be synchronized with the specific frequency. For example, the first gate control signal G1 may be provided to the first switching unit 19 and the second gate control signal G2 may be provided to the second switching unit 21.

Each of the first and second gate control signals (G1 and G2 in FIG. 3) may be a signal in which a pulse having a high level is periodically generated.

The first and second gate control signals (G1, G2 in FIG. 3) may have phase of the pulses opposite to each other.

Figure 3:
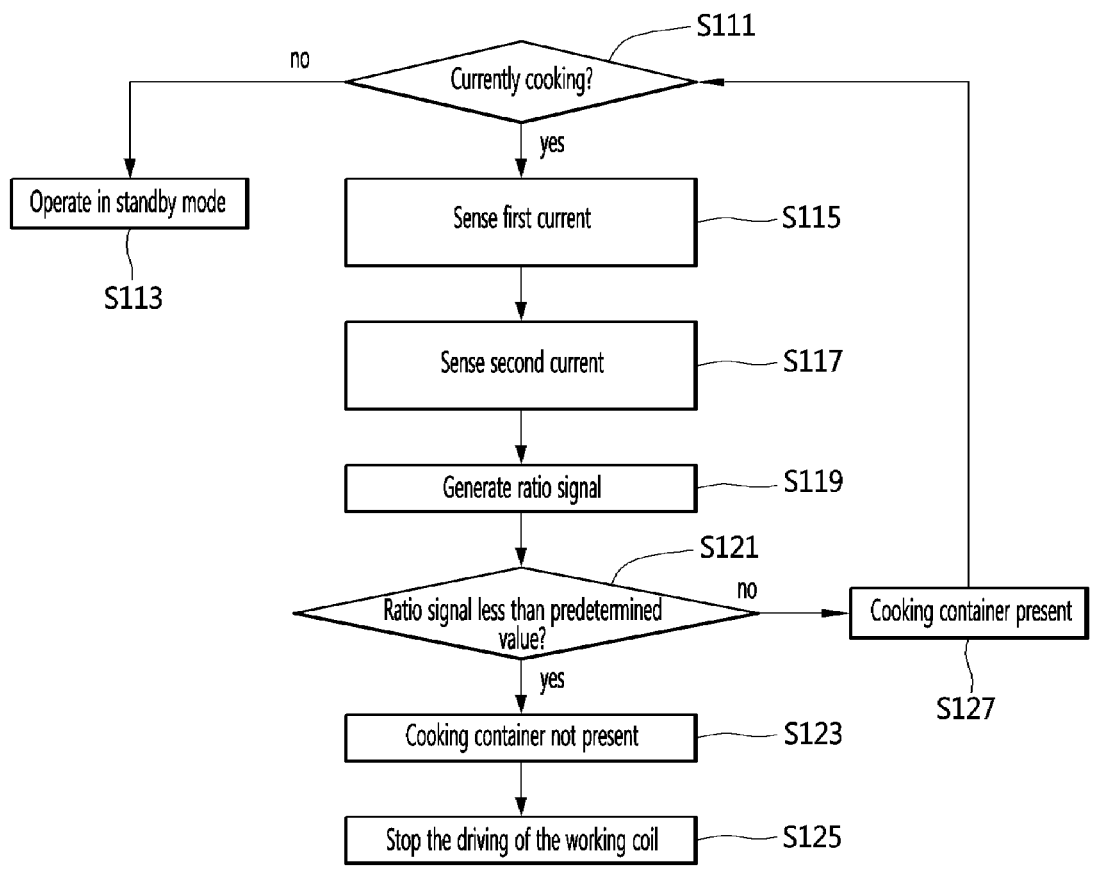
FIG. 3 is a flowchart illustrating a method of sensing a cooking container in an induction heating cooker according to an embodiment of the present invention.

For example, when a pulse having a high level of the first gate control signal (G1 in FIG. 3) is provided to the first switching unit 19, a second gate control signal G2 in FIG. 3) may be provided to the second switching unit 21.

The working coil 25 is connected between the second node n2 and the third node n3 so that the first and second switching units 19 and 21 are alternately turned on to each other and an alternating current can be applied to the working coil 25.

Therefore, the controller 17 can control the food in the cooking container to be cooked by using the working coil 25.

On the other hand, the induction heating cooker of the present invention can detect the absence of the cooking container while allowing the food of the cooking container to be cooked.

By sensing the absence of such a cooking container, when the cooking container is not placed on the working coil 25, the cooking coil 25 is not driven even if the cooking heating start signal is input. Also, the working coil 25 is not driven when the cooking container is removed while the cooking container is placed on the working coil 25 and the food is cooked.

In order to improve the product reliability of the cooking container, it is necessary to detect the absence of the cooking container more accurately and to minimize the detection error.

In the present invention, the absence of the cooking container can be sensed by using the resonance current.

That is, the resonance current is provided to the controller 17, the resonance current is digitally processed in the controller 17 and converted into a digital voltage, and the absence of the cooking container can be determined by comparing the digital voltage with a predetermined value.

For example, when the digital voltage is equal to or higher than the predetermined value, it can be determined that the cooking container is present on the working coil 25.

For example, when the digital voltage is less than the predetermined value, it can be determined that the cooking container does not exist on the working coil 25.

When the absense of the cooking container is sensed using the resonance current, the resonance current flowing in the working coil 25 may have a large resonance current sensing error since the resonance current is influenced by the resistance, the working coil 25, the gap between the working coil 25 and the cooking container, and the mechanical assembly scattering.

In order to solve this problem, the present invention may further include first and second current sensing units 13 and 23 as shown in FIG. 1.

The first current sensing unit 13 is connected between the power supply 11 and the rectifying unit 15 and can sense a first current (I1 in FIG. 2) flowing from the power supply 11 to the rectifying unit 15.

The second current sensing unit 23 is connected to one side of the working coil 25, that is, between the second node n2 and the working coil 25 to sense a second current (I2 in FIG. 2) flowing in the working coil 25.

The first current (I1 in FIG. 2) is an input current flowing from the power supply 11 to the rectifying unit 15, and the second current (I2 in FIG. 2) is a resonant current formed by the LC resonance circuit. The LC resonance circuit can be constituted by the inductance component L of the working coil 25 and the capacitance component C of the first capacitor 27 and/or the second capacitor 29.

In the present invention, the absence of the cooking container can be detected by using the ratio (I1/I2) of the first current (I1 in FIG. 2) sensed by the first current sensing unit 13 to the second current I2 sensed by the second current sensing unit 23.

The first current (I1 in FIG. 2) sensed by the first current sensing unit 13 to the second current I2 sensed by the second current sensing unit 23 may be provided to the controller 17.

The first and second currents (I1, I2 in FIG. 2) may be analog signals, but it is not limited thereto.

Figure 2:
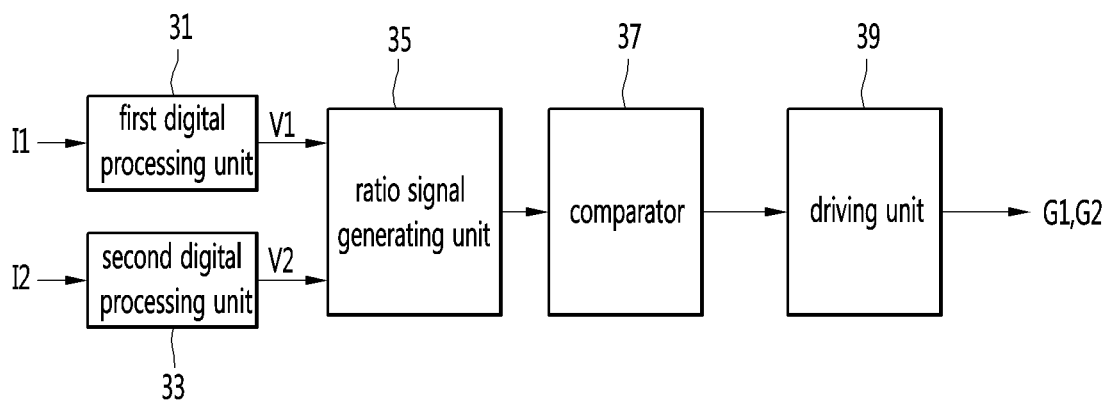
FIG. 2 is a detailed view of the controller of FIG. 1.

Specially, as shown in FIG. 2, the controller 17 includes a first digital processing unit 31, a second digital processing unit 33, a ratio signal generating unit 35, a comparing unit 37, and a driving unit 39.

The first current I1 sensed by the first current sensing unit 13 is supplied to the first digital processing unit 31 and the second current I2 sensed by the second current sensing unit 23 is supplied to the second digital sensor 31.

The first digital processing unit 31 may digitally process the first current I1 to generate a first signal V1. The second digital processing section 33 can digitally process the second current I2 to generate a second signal V2

Although each of the first and second signals V1 and V2 may be a voltage signal, but it is not limited thereto.

The ratio signal generator 35 generates a ratio signal Data_ratio based on the first signal V1 generated by the first digital processor 31 and the second signal V2 generated by the second digital processor 33.

Here, the ratio signal Data_ratio can be expressed by Equation 1.

$$\text{Data\_ratio} = V2/V1 \qquad \text{Formula 1}$$

In the present invention, it is described that the numerator is the second signal (V2) and the denominator is the first signal (V1) in the ratio signal Data_ratio, but the ratio signal may be generated assuming that the numerator is the first signal (V1) and the denominator is the second signal (V2).

The comparator 37 compares the ratio signal Data_ratio with a predetermined value, and can determine the absence of the cooking container according to the comparison result.

For example, when the cooking container is not placed on the working coil 25, the second current I2 is about 1 to 2 times greater than the first current I1. In this case, the second signal V2 may be 1 to 2 times greater than the first signal V1 digitally processed by the first and second digital processing units 31 and 32.

For example, when the cooking container is placed on the working coil 25, the second current I2 is at least twice as large as the first current I1. In this case, the second signal V2 is greater than the first signal V1 digitally processed by the first and second digital processing units 31 and 33 by at least two times.

For example, the predetermined value may be set to two.

In the case where the predetermined value is set as described above, when the ratio signal Data_ratio is greater than the predetermined value, it can be determined that the cooking container is placed on the working coil 25.

When the ratio signal Data_ratio is less than the predetermined value, it can be determined that the cooking container is not placed on the working coil 25.

According to the present invention, not only the second current I2 is sensed near the working coil 25 but also the first current I1 is detected from the output terminal of the power supply unit 11, and it is possible to determine the absence of the cooking container based on the ratio of the first and second currents I1/I2 so that despite factors affecting the sensing error, such as the resistance, the working coil 25, the gap between the wagging coil and the cooking container, and the mechanical assembly scattering, the detection error of the absence of the cooking container can be minimized.

The controller 17 controls switching of the first and second switching units 19 and 21 using the first and second gate control signals G1 and G2 generated from the driving unit 39 based on the comparison result from the comparing unit 37.

The controller 17 continuously controls the driving unit 39 to generate the first and second gate control signals G1 and G2 in the case where the cooking container is currently being cooked when it is determined that the cooking container is normally present on the working coil 25 as a result of the comparison from the comparing unit 37. The first and second switching units 19 and 21 are alternately turned on and off by using the first and second gate control signals G1 and G2 so that the resonance current may continuously flow in the working coil 25.

As a result of the comparison from the comparing unit 37, when the controller 17 determines that the cooking container is normally present on the working coil 25, but if it is not currently being cooked, the controller 17 operates in the standby mode until the cooking heating start signal is input. When the cooking heating start signal is input, the controller 17 alternately switches the first and second switching units 19 and 21 through the driving unit 39 to apply a resonant current to the working coil 25.

As a result of the comparison from the comparing unit 37, when the controller 17 determines that the cooking container is not present on the working coil 25 and is currently cooking, the controller 17 determines that the cooking container has been removed, controls the driving unit 39 to provide the first and second switching units 19 and 21 with an off signal so that the first and second switching units 19 and 21 are no longer operated. The off signal may be the first and second gate control signals G1 and G2 having a low level DC voltage. As a result, the resonance current does not flow in the working coil 25 so that the risk that the working coil 25 is heated can be prevented.

As a result of the comparison from the comparing unit 37, when the controller 17 determines that the cooking vessel is not present on the working coil 25 because the cooking vessel is not present on the working coil 25, the controller 17 controls the driving unit 39 to provide the first and second switching units 19 and 21 with an off signal so that the first and second switching units 19 and 21 are no longer operated. The off signal may always be a gate control signal having a low level.

FIG. 3 is a flowchart illustrating a method of sensing a cooking container of an induction heating cooker according to an embodiment of the present invention.

Referring to FIGS. 1 and 3, the controller 17 can determine whether the cooking is currently being performed (S111).

For example, when the cooking heating start signal is input, the first and second switching units 19 and 21 are alternately switched and controlled so that a resonant current flows through the working coil 25 so that the food of the container can be cooked.

Therefore, the controller 17 can determine whether the cooking is currently being performed through the input of the cooking-cooking start signal.

If no cooking heating start signal is input, the controller 17 determines that the cooking mode is not currently being cooked and controls to operate in the standby mode (S113). In this case, an off signal is provided to the first and second switching units 19 and 21 so that the first and second switching units 19 and 21 are turned off. Thus, the DC voltage from the rectifying unit 15 does not flow to the working coil 25, and the working coil 25 is no longer driven.

When the cooking heating start signal is input, the controller 17 can determine that the cooking is currently being performed.

Thereafter, the first current I1 may be sensed from the first current sensing unit 13 and provided to the controller 17 (S115).

The first current sensing unit 13 is connected between the output terminal of the power supply 11, that is between the power supply 11 and the rectifying unit 15, and detects the input current flowing from the power supply 11 to the rectifying unit 15.

In addition, the second current I2 may be sensed by the second current sensing unit 23 and supplied to the controller 17 (S117).

The second current sensing unit 23 may be connected with the working coil 25 between the second node n2 and the third node n3 to sense the resonant current flowing through the working coil 25.

Although the first current I1 is detected earlier than the second current I2 in the present invention, the first current I1 and the second current I2 may be sensed at the same time.

The controller 17 generates a ratio signal Data_ratio based on the first current I1 sensed by the first current sensing unit 13 and the second current I2 sensed by the second current sensing unit 23 (S119).

The ratio signal Data_ratio is a signal indicating the ratio I2/I1 of the second current I2 to the first current I1. When the first and second currents I1 and I2 are digitally processed, the ratio signal Data_ratio is a signal indicating the ratio V2/V1 of the first signal (V2) and the first signal (V1).

The controller 17 compares the ratio signal Data_ratio with the predetermined value to determine whether or not the cooking container is present (S121).

If the ratio signal is less than the predetermined value, the controller 17 can determine that the cooking container is not present on the working coil 25 (S123).

when it is determined that the cooking container is not present, the controller 17 turns off the first and second switching units 19 and 21 regardless of whether the cooking container is currently being cooked or not so that the driving can be stopped (S125)

That is, when it is determined that the cooking container is not present and is currently being cooked, the controller 17 determines that the cooking container has been removed during cooking, and provides an off signal to the first and second switching units 19 and 21 so that the first and second switching units 19 and 21 are no longer driven and no resonant current flows through the working coil 25.

when it is determined that the cooking container is not present and is not currently being cooked, the controller 17 controls the driving unit 39 to provide an off signal to the first and second switching units 19 and 21 so that the first and second switching units 19 and 21 are not operated.

When the ratio signal Data_ratio is greater than the predetermined value, it can be determined that the cooking container is present on the working coil 25 (S127).

When it is determined that there is a cooking container, the controller 17 proceeds to S111 and continuously controls the first and second switching units 19 and 21 to be alternately switched to the working coil 25.

When it is determined that the cooking container is present, the process proceeds to S111, and if the cooking container is not currently being cooked, the controller 17 may move to S113 and control to operate in the standby mode.

The foregoing detailed description should not be construed in all aspects as limiting and should be considered illustrative. The scope of the present invention should be determined by rational interpretation of the appended claims, and all changes within the scope of equivalents of the present invention are included in the scope of the present invention.

INDUSTRIAL APPLICABILITY

The sensing device of the present invention may be used in an induction heating cooker.

The invention claimed is:

1. A device of sensing a cooking container in an induction heating cooker, the induction heating cooker comprising a rectifying unit for rectifying an AC voltage from a power supply to a DC voltage and first and second switching units for switching to alternately apply the DC voltage from the rectifying unit to a working coil for driving the working coil, comprises:
- a first current sensing unit connected between the power supply and the rectifying unit to sense a first current flowing between the power supply and the rectifying unit;
- a second current sensing unit connected between a node and the working coil to sense a second current flowing to the working coil, the node being connected to the first switching unit and to the second switching unit; and
- a controller,
- wherein the controller is configured:
  - to digitally process the first current and the second current, respectively to generate a first digital signal and a second digital signal,
  - to generate a ratio signal based on the first digital signal and the second digital signal,
  - to compare the ratio signal with a predetermined value,
  - to determine that the cooking container is present on the working coil when the ratio signal is greater than the predetermined value, to continuously drive the working coil, and
  - to determine that the cooking container is not present on the working coil when the ratio signal is less than the predetermined value, to stop the driving of the working coil,
  - wherein the ratio signal includes a numerator and a denominator, the numerator is the second digital signal, and the denominator is the first digital signal.

2. A method of sensing a cooking container in an induction heating cooker, the induction heating cooker comprising a rectifying unit for rectifying an AC voltage from a power supply to a DC voltage and first and second switching units for switching to alternately apply the DC voltage from the rectifying unit to a working coil for driving the working coil, comprising:
- connecting between the power supply and the rectifying unit to sense a first current flowing between the power supply and the rectifying unit;
- connecting between a node between the first and second switching units and the working coil to sense a second current flowing to the working coil;
- digitally processing the first current and the second current, respectively to generate a first digital signal and a second digital signal,
- generating a ratio signal based on the first digital signal and the second digital signal,
- comparing the ratio signal with a predetermined value,
- determining that the cooking container is present on the working coil when the ratio signal is greater than the predetermined value, to continuously drive the working coil, and
- determining that the cooking container is not present on the working coil when the ratio signal is less than the predetermined value, to stop the driving of the working coil,
- wherein the ratio signal includes a numerator and a denominator, the numerator is the second digital signal, and the denominator is the first digital signal.

3. An induction heating cooker, comprises:
- a power supply configured to generate an AC voltage;
- a rectifying unit configured to rectify the generated AC voltage to a DC voltage;
- first and second switching units configured to switch the DC voltage from the rectifying unit to alternately apply the DC voltage to a working coil for driving the working coil;
- a first current sensing unit connected between the power supply and the rectifying unit to sense a first current flowing between the power supply and the rectifying unit;
- a second current sensing unit connected between a node between the first and second switching units and the working coil to sense a second current flowing to the working coil; and
- a controller,
- wherein the controller is configured:
  - to digitally process the first current and the second current, respectively to generate a first digital signal and a second digital signal,
  - to generate a ratio signal based on the first digital signal and the second digital signal,
  - to compare the ratio signal with a predetermined value,
  - to determine that a cooking container is present on the working coil when the ratio signal is greater than the predetermined value, to continuously drive the working coil, and
  - to determine that the cooking container is not present on the working coil when the ratio signal is less than the predetermined value, to stop the driving of the working coil,
  - wherein the ratio signal includes a numerator and a denominator, the numerator is the second digital signal, and the denominator is the first digital signal.

* * * * *